(12) United States Patent
Ellison et al.

(10) Patent No.: US 8,097,524 B2
(45) Date of Patent: Jan. 17, 2012

(54) LIGHTLY DOPED SILICON CARBIDE WAFER AND USE THEREOF IN HIGH POWER DEVICES

(75) Inventors: Alexandre Ellison, Linköping (SE); Björn Magnusson, Linköping (SE); Asko Vehanen, Esbo (FI); Dietrich Stephani, Bubenreuth (DE); Heinz Mitlehner, Uttenreuth (DE); Peter Friedrichs, Nürnberg (DE)

(73) Assignees: Norstel AB, Norrköping (SE); Siced Electronics Development GmbH & Co. KG, Erlangen (DE)

( * ) Notice: Subject to any disclaimer, the term of this patent is extended or adjusted under 35 U.S.C. 154(b) by 237 days.

(21) Appl. No.: 12/352,793

(22) Filed: Jan. 13, 2009

(65) Prior Publication Data

US 2009/0114924 A1 May 7, 2009

Related U.S. Application Data

(62) Division of application No. 10/526,059, filed as application No. PCT/SE03/01309 on Aug. 22, 2003, now Pat. No. 7,482,068.

(30) Foreign Application Priority Data

Aug. 30, 2002 (SE) ...................................... 0202585

(51) Int. Cl.
*C30B 15/14* (2006.01)
(52) U.S. Cl. .................. 438/460; 257/77; 257/E31.023; 117/3
(58) Field of Classification Search .................... 257/77, 257/139, E31.023, E21.002; 438/45, 369, 438/371, 460; 117/3
See application file for complete search history.

(56) References Cited

U.S. PATENT DOCUMENTS

| 5,043,773 A | 8/1991 | Precht et al. |
| 5,709,745 A | 1/1998 | Larkin et al. |
| 5,736,430 A | 4/1998 | Seefeldt et al. |
| 6,180,958 B1 | 1/2001 | Cooper |

(Continued)

FOREIGN PATENT DOCUMENTS

JP 2000-216090 8/2000

(Continued)

OTHER PUBLICATIONS

Jenny, J.R., et al; "Effects of annealing on carrier lifetime in 4H—SiC," *Journal of Applied Physics* 100, pp. 113710-113710-6 (2006).

(Continued)

*Primary Examiner* — Matthew Landau
*Assistant Examiner* — Colleen E Snow
(74) *Attorney, Agent, or Firm* — Venable LLP; Eric J. Franklin

(57) ABSTRACT

A method for manufacturing a silicon carbide single crystal. A silicon carbide single crystal is grown. The crystal has a boron concentration less than $5 \times 10^{14}$ cm$^{-3}$, and a concentration of transition metals impurities less than $5 \times 10^{14}$ cm$^{-3}$. Intrinsic defects in the crystal are minimised. The intrinsic defects include silicon vacancies or carbon vacancies. The crystal is annealed for a desired time at a temperature above 700° C. in an atmosphere containing any of the gases hydrogen or a mixture of hydrogen and an inert gas, such that the density of intrinsic defects and any associated defects is decreased to a concentration low enough to confer to the crystal a desired carrier life time of at least 50 ns at room temperature.

9 Claims, 9 Drawing Sheets

U.S. PATENT DOCUMENTS

| | | | |
|---|---|---|---|
| 6,218,680 | B1 | 4/2001 | Carter et al. |
| 6,734,461 | B1 | 5/2004 | Shiomi et al. |
| 6,815,309 | B2 * | 11/2004 | Letertre et al. ............... 438/406 |
| 6,964,917 | B2 * | 11/2005 | Tsvetkov et al. ............. 438/512 |
| 2002/0019117 | A1 | 2/2002 | Nagasawa |
| 2002/0056411 | A1 | 5/2002 | Hara et al. |
| 2003/0080384 | A1 * | 5/2003 | Takahashi et al. ............ 257/347 |
| 2003/0233975 | A1 * | 12/2003 | Jenny et al. .................... 117/30 |

FOREIGN PATENT DOCUMENTS

| | | |
|---|---|---|
| JP | 2001-511315 | 8/2001 |
| JP | 2002-57109 | 2/2002 |
| JP | 2002-151692 A | 5/2002 |
| JP | 2002-154899 | 5/2002 |
| JP | 2003-502857 | 1/2003 |
| WO | WO-98/35390 | 8/1998 |
| WO | WO-00/79570 A2 | 12/2000 |
| WO | WO-01/18872 A1 | 3/2001 |

OTHER PUBLICATIONS

Jenny, J.R., et al., "Optical and electrical characterization of boron impurities in silicon carbide grown by physical vapor transport," *J. Appl. Phys.* 79(5), pp. 2326-2331 (Mar. 1996).

Trivedi, M., et al., "High Temperature Performance Limits of IGBT Modules," *IEEE*, pp. 997-981 (1998).

Itoh, Akira, et al., "Single Crystal Growth of SiC and Electronic Devices, "*Critical Reviews in Solid State and Materials Sciences*, 22(2), pp. 111-197 (1997).

Kordina et al. "Long minority carrier lifetime in 6H SiC grown by chemical vapor deposition". Appl. Phys. Lett. 66 (2), Jan. 9, 1995. pp. 189-191.

Kordina et al. "The minority carrier lifetime on n-type 4H and 6H-SiC epitaxial layers". Appl. Phys. Lett. 69 (5), Jul. 29, 1996. pp. 679-681.

Notice of Reason for Refusal issued by the Japanese Patent Office in connection with counterpart Japanese Application No. 2004-532493, Aug. 31, 2010.

Decision of Refusal from the Japanese Patent Office, issued in connection with corresponding Japanese Patent Application No. 2004-532493.

* cited by examiner

LIGHTLY DOPED SILICON CARBIDE WAFER AND USE THEREOF IN HIGH POWER DEVICES

CROSS-REFERENCE TO RELATED APPLICATIONS

This application is a divisional application of U.S. patent application Ser. No. 10/526,059 filed 13 Oct. 2005 now U.S. Pat. No. 7,482,068, which was the national phase under 35 U.S.C. §371 of PCT/SE2003/001309 filed 22 Aug. 2003, and which claimed priority to Swedish patent application 0202585-6 filed 30 Aug. 2002.

FIELD OF THE INVENTION

The invention relates to a lightly doped n-type or p-type silicon carbide wafer having a sufficiently low concentration of deep levels originating from either impurities, intrinsic defects or structural defects to enable free carriers injected into such wafer to recombine with a lifetime of interest for bipolar power devices, the use of a lightly doped n- or p-type silicon carbide wafer as base region of a high power device structure such as an IGBT with a voltage blocking capability of 15 kV or more.

BACKGROUND AND PRIOR ART

Currently, the highest breakdown voltages achieved by silicon power devices range from 4.5 to 6.5 kV for IGBTS and GTOs, and 9 to 12 kV for thyristors. The ability of these switching devices to handle higher voltages is today limited by technological factors, such as requirements of serial operations, and by the physical properties of the silicon semiconductor. It is considered that higher voltage (>10 kV) electrical transmission systems would benefit from the higher critical electrical field of the wider band-gap silicon carbide semiconductor. In addition, for an equivalent voltage rating, silicon carbide devices offer the advantages of lower on state resistances and lower switching losses than their silicon counterparts.

An example structure according to the prior art, comprising a lightly doped voltage blocking layer 3 deposited on a SiC substrate 1 is illustrated in FIG. 1. At present, all such voltage supporting SiC layers are epitaxially grown on highly doped off-oriented SiC substrates 1. The established method for growing such layers 3 is the CVD technique carried out at temperatures around 1600° C. The advantage of the CVD technique lies in its ability to meet the low n- or p-type doping (typically $10^{15}$ cm$^{-3}$ range and lower) and the high carrier lifetime (several hundreds of nanoseconds) requirements needed for SiC bipolar devices. The main disadvantage of the CVD process lies in its low growth rate and thus high cost for layers thicker than 100 μm. For example, at a growth rate ranging between 5 and 10 μm/h, a 250 μm thick drift zone for a 20 kV blocking layer at $N_D \sim 3 \times 10^{14}$ cm$^{-3}$, the existing CVD processes require growth times as long as 25 to 50 hours.

In the silicon technology, the high cost of epitaxial power device structures has been tackled by using, instead of a thick low doped epilayer grown on a conductive substrate, a low doped silicon wafer as drift zone. The starting wafers for state-of-the-art high power silicon devices are 4 to 6 inch diameter neutron transmuted wafers manufactured from float-zone grown Si crystals. For example, the drift region of a 5 kV switching device uses an approximately 500 μm thick silicon wafer with a doping of $2 \times 10^{13}$ cm$^{-3}$.

This technology presently limits silicon power devices to voltage handling capabilities to the 10 kV range. A 25 kV silicon device would require the use of a wafer 2 mm thick as drift zone with a doping of $10^{12}$ cm$^{-3}$ or less and a carrier lifetime of 400 μs. A silicon carbide switching device would use an order of magnitude thinner drift zone, one to two orders of magnitude higher doping and lower carrier lifetime to achieve the same blocking voltage, while offering the advantages of a lower on state resistance and lower switching losses.

This approach can however not be used with the present state-of-the-art silicon carbide wafers due to the lack of lightly doped, microsecond range lifetime, SiC wafers. SiC wafers are presently available for the use as substrates in the lower range resistivity (n-type, ca. 0.015 Ωcm and p-type ca. 2.5 Ωcm) and in semi-insulating form (p>$10^6$ Ωcm). For the low resistivity substrates, the shallow dopants concentrations (e.g. nitrogen or aluminium) are typically in the $10^{18}$ cm$^{-3}$ range or higher, whereas semi-insulating substrates contain a higher density of deep levels (intrinsic or extrinsic) than shallow levels (e.g. nitrogen). Neither a low resistivity substrate, which has no reverse voltage supporting capability, nor a semi-insulating substrate, where the free carriers lifetime is less than a few nanoseconds, can thus be used as a drift zone for power devices.

Vertical SiC semiconductor power devices fabricated on "low resistivity" p-type substrates exist up to now only in theory since a suitable base material with sufficient conductivity is not available (approx. 8 Ωcm vs. 0.02 Ωcm for n-type material). The reason for this lack can be attributed to the current technology of the most common crystal growth process. The incorporation of aluminum is hard to control in sublimation growth furnaces especially in the case of high doping concentrations. Additionally the ionization energy of all known acceptors in silicon carbide is comparably high. Thus, it is not possible to fabricate an attractive IGBT like structure using a p-type substrate with a n-type drift zone grown by epitaxy. Additionally, also assuming the availability of a suited base material, there are only restricted possibilities to adjust device parameters by lifetime modulation near the backward emitter of a deduced IGBT structure (FIG. 1).

Up to know, the realized IBGT structures on epitaxied SiC substrates suffer from unsatisfactory technical parameters. In all cases, the base material was p-type with a very low conductivity. The successful realization of a classical IGBT structure using a MOS Gate seems not to be possible, since in this case the oxide stress is very high and the reliability will be strongly degraded (except using adequate shielding precautions).

PURPOSE AND SUMMARY OF THE INVENTION

Material Purpose and Summary

The object of this invention is to provide a method to fabricate SiC wafers from lightly doped n- or p-type crystals having a quality such that the entire wafer (FIG. 2) can be used as the drift zone of high voltage power devices. This method can provide a lower cost solution than the conventional CVD growth of a thick (>100 μm) lightly doped layer on a low resistivity SiC wafer used as substrate for the epitaxy. The invention also enables a new efficient design of SiC switching devices such as IGBTs.

Device Purpose and Summary

The most important advantage of the invention is the possibility to fabricate a semiconductor structure without a low resistivity substrate, which in the case of a vertical power device represents only an unnecessary additional resistance. The whole wafer consists now of a low doped n-drift zone (FIG. 2) able to block very high voltages (larger than 15 kV).

DETAILED DESCRIPTION OF THE INVENTION

Material Description

Figure 1:
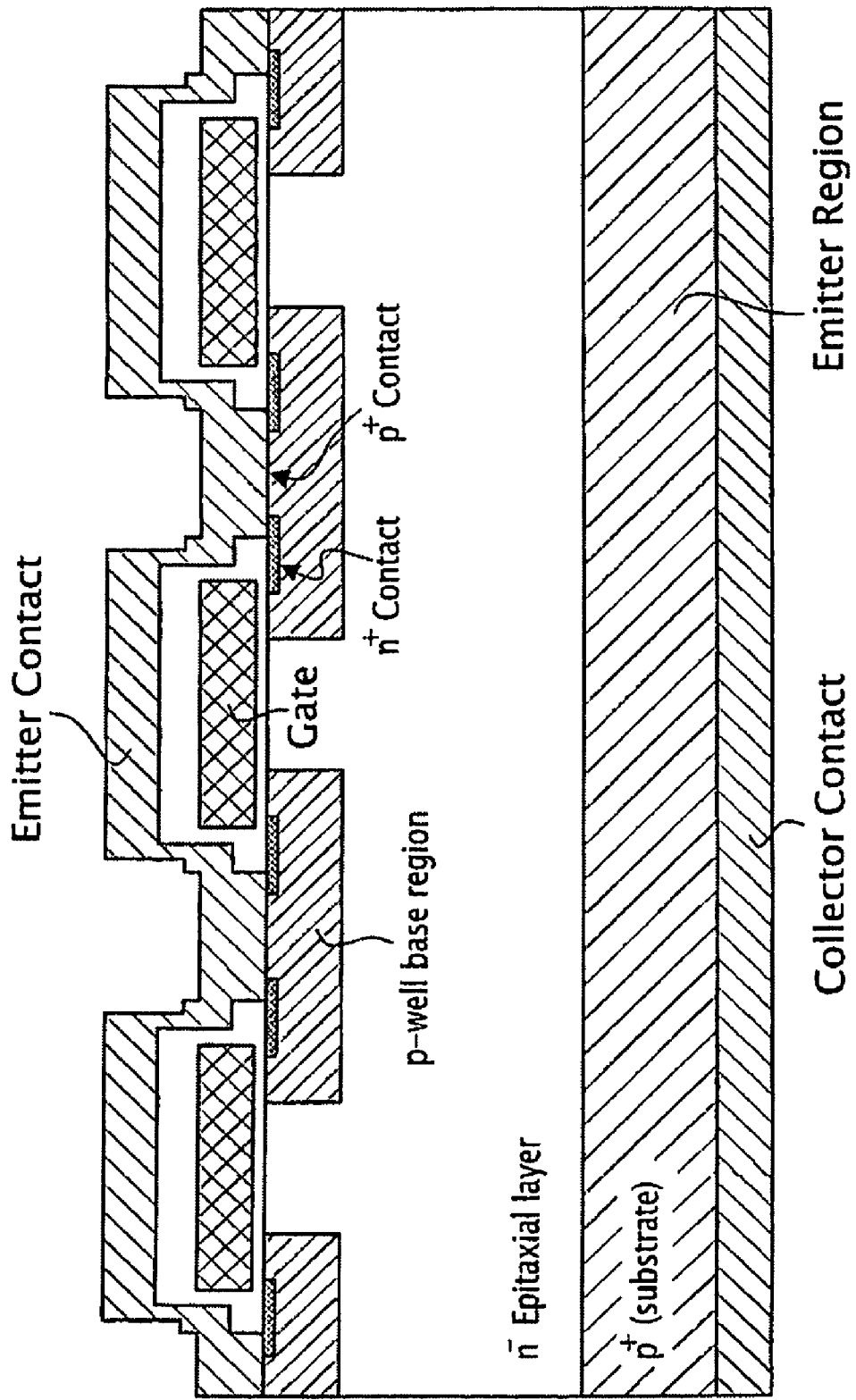
FIG. 1 illustrates a prior-art cross-sectional view of a classical IGBT SiC structure where the thick, lightly doped drift layer having a substantial carrier lifetime, is epitaxially grown on a highly doped p-type SiC substrate.

In order to enable a suitable operation in a bipolar device, the drift zone region must meet several requirements. The first one is a low doping, typically a net carrier concentration in the $10^{13}$ to $10^{14}$ cm$^{-3}$ range, and a sufficient thickness of the order 100-300 μm, in order to sustain high voltages.

A second requirement is a sufficient lifetime of the carriers injected into the drift region under forward bias so that the resulting conduction modulation allows a high current density. The presence of defect levels within the band gap, acting as recombination centers, will adversely affect the carrier's lifetime. The concentration of efficient recombination centers, such as deep levels which can exchange carriers with both the conduction and the valence band, must therefore be kept as low as required by the desired device performance. Several defects are known to give rise to deep levels in SiC, such as transition metals and intrinsic defects. Certain structural defects such as stacking faults and low angle boundaries must also be avoided as they have been identified as lifetime killers.

The wafers manufactured from silicon carbide crystals grown by the conventional sublimation, or physical vapour transport (PVT) method are at present not pure enough for being useful as drift region in a power device. Even in the highest purity wafers sliced from PVT grown crystals, the nitrogen concentration remains of the order of $5 \times 10^{16}$ cm$^{-3}$. Furthermore, it has never been possible, to the best knowledge of the inventors, to detect any free carrier lifetime in such wafers, which are therefore only used as substrates for epitaxial growth of layers.

One object of the present invention is to provide a method for growing lower doped silicon carbide crystals from which wafers of higher purity and long free carrier lifetime can be manufactured.

As described in U.S. Pat. Nos. 5,704,985-6,030,6612 and 6,039,812 which teachings are hereby incorporated by reference, a preferred method for growing higher purity SiC crystals is the so-called High Temperature Chemical Vapour Deposition (HTCVD) method. In this vapour phase technique, the silicon and carbon containing source material is supplied by purified gases, as in conventional CVD methods. For example silane ($SiH_4$) is used as a silicon precursor whereas a hydrocarbon such as methane ($CH_4$) or ethylene ($C_2H_4$) is used as a carbon precursor. The growth of a SiC crystal, or boule, from which wafers of a desired diameter and thickness can subsequently be sliced and polished, is achieved by exposing, for a desired length of time, a SiC seed crystal heated to a temperature above 1900° C. to a continuous flow of source gases. A carrier gas, such as helium, argon or hydrogen, is used to aid the transport of the precursors.

Some of the advantages of the HTCVD technique for the present invention are the use of ultra high purity gases as source material, the ability to optimise the carbon to silicon ratio of the gases mixture and the ability to continuously feed a desired amount of doping source gas. For example, the SiC crystal can be made slightly n-type by introducing a small amount of nitrogen gas into the source gases mixture. The flow rate of the nitrogen precursor can be regulated by the means of mass flow controllers, using for example, a dilution configuration. The technique uses growth temperatures above 1900° C. which enables to grow single polytype crystals on both so-called on- and off-axis seeds. An on-axis seed crystal is here defined as a seed where the surface exposed to the source gases mixtures is parallel within a few tenths of a degree to a crystallographic plane, e.g. the (0001) plane. An off-axis seed crystal has an exposed surface intentionally more than a half degree from a reference crystallographic plane.

As compared to the conventional CVD method, which uses highly doped substrates off-oriented up to 8 degrees to provide a sufficient density of atomic steps, the HTCVD method allows to grow SiC crystals on seeds with substantially lower step densities, using on-axis or only slightly misoriented (1 degree or less) seed crystals. Both on-axis and low-misorientation wafers can be sliced and polished from such crystals. The use of such wafers as voltage blocking layer of high power devices has the advantage of reducing electrical field anisotropy effects.

Although the invention is illustrated for the growth of the 4H polytype, or crystal lattice variant of the silicon carbide crystal, it is clear that the method can also be used to grow lightly doped crystals of other polytypes, such as for example 6H, 15R or 3C. The method is illustrated for crystals grown along, or near to, the c-axis of the crystal lattice. It may also be applied for crystals grown along other directions, as for example the a-axis directions such as [11$\bar{2}$0] or [10$\bar{1}$0] or any direction in-between the c- and a-axis of the SiC crystal lattice.

Although a preferred method is described to illustrate the feasibility of the invention, persons skilled in the field may modify the invention while still realising the same type of results. In particular the experimental values of the carrier lifetime are to be understood as not limited to the examples given below, which can be improved by modifying the invention.

In a first embodiment, the invention concerns a novel method to prepare lightly doped SiC wafers in which free carriers injected by, either operating a device manufactured upon these wafers, or by optical excitation, recombine with a certain rate. The first embodiment concerns the growth of a SiC crystal with a determined low n- or p-type doping followed by a post-growth thermal treatment of either the crystal itself or of the wafers sliced from this crystal.

Figure 3:
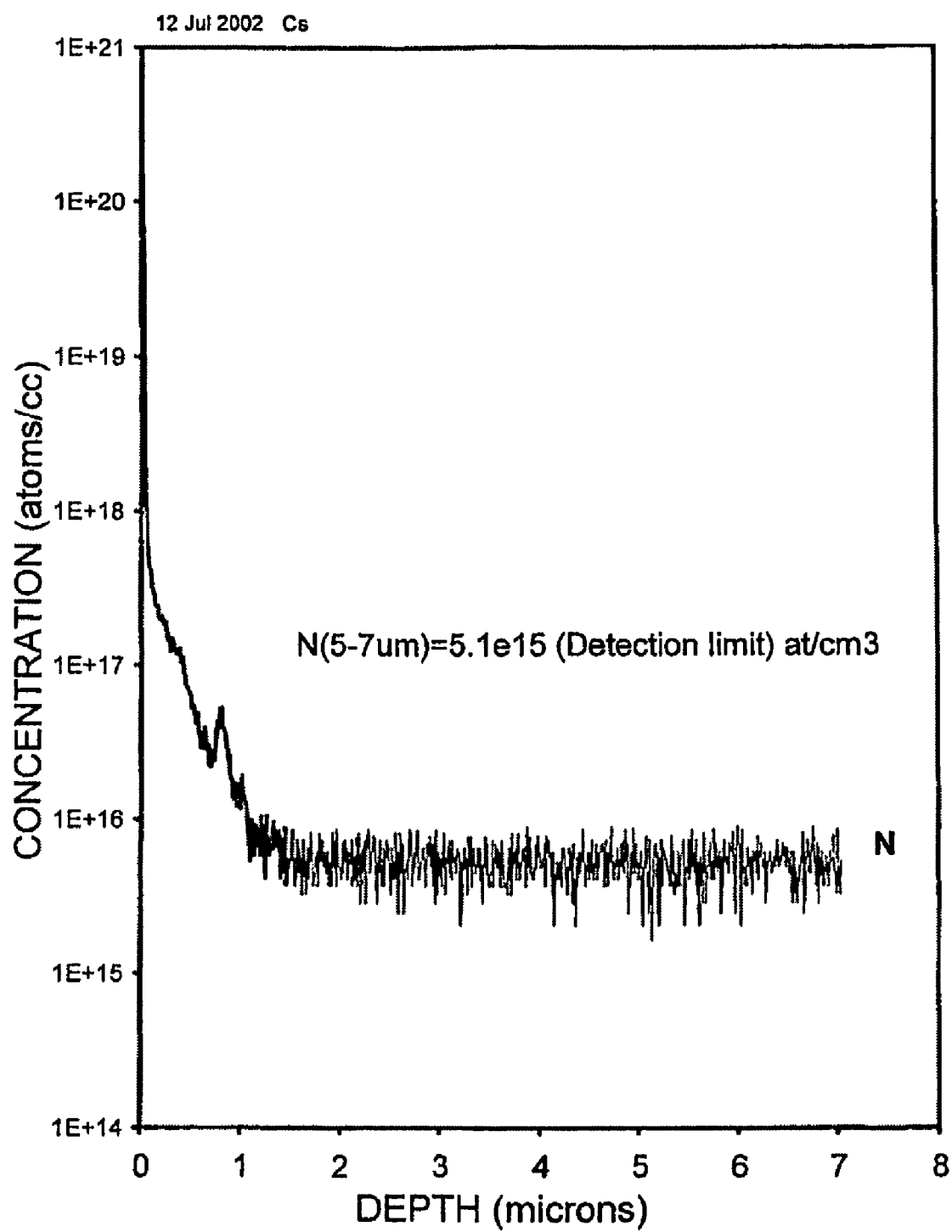
FIG. 3 is a SIMS profile of the nitrogen concentration of a lightly doped (N⁻) 4H SiC wafer, showing that the nitrogen concentration is below the detection limit of the measurement.
Figure 4:
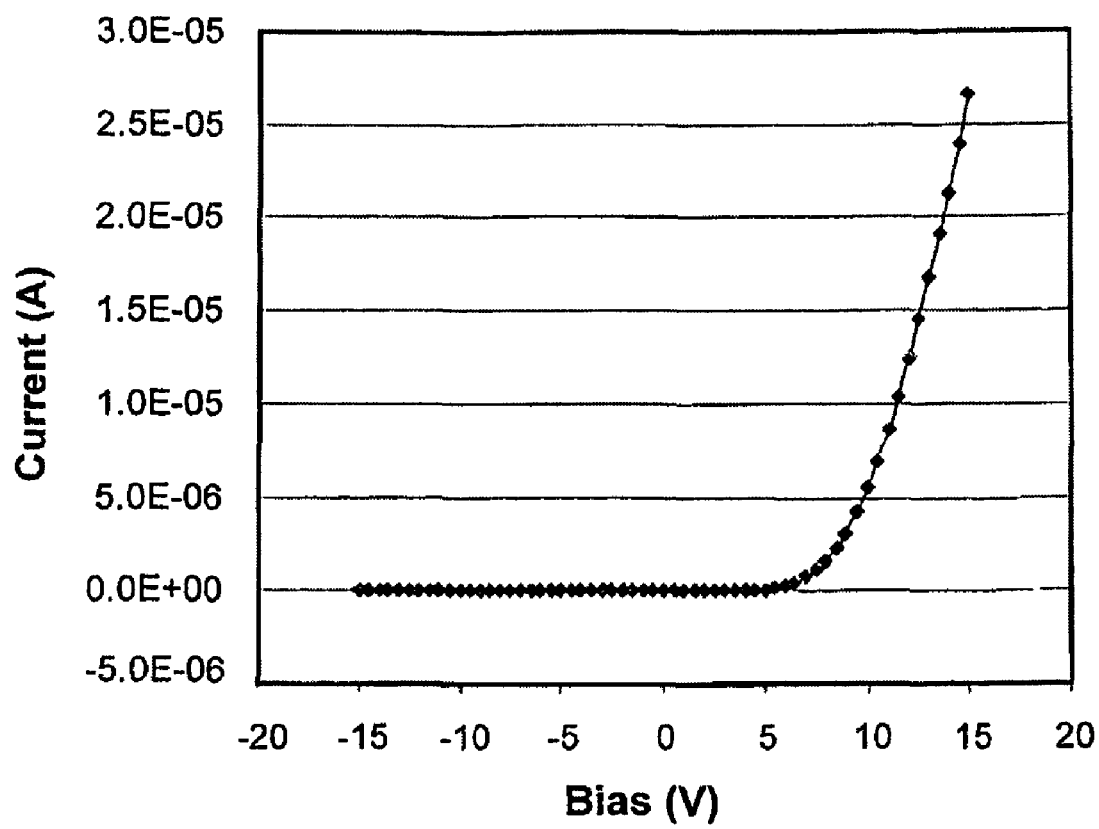
FIG. 4 Top: Current-voltage measurement using a Schottky diode contact on an intentionally lightly doped (N⁻) 4H SiC substrate showing n-type conductivity. Bottom: The net carrier concentration measured by capacitance-voltage yields a mean value of $4 \times 10^{14}$ cm$^{-3}$.
Figure 4:
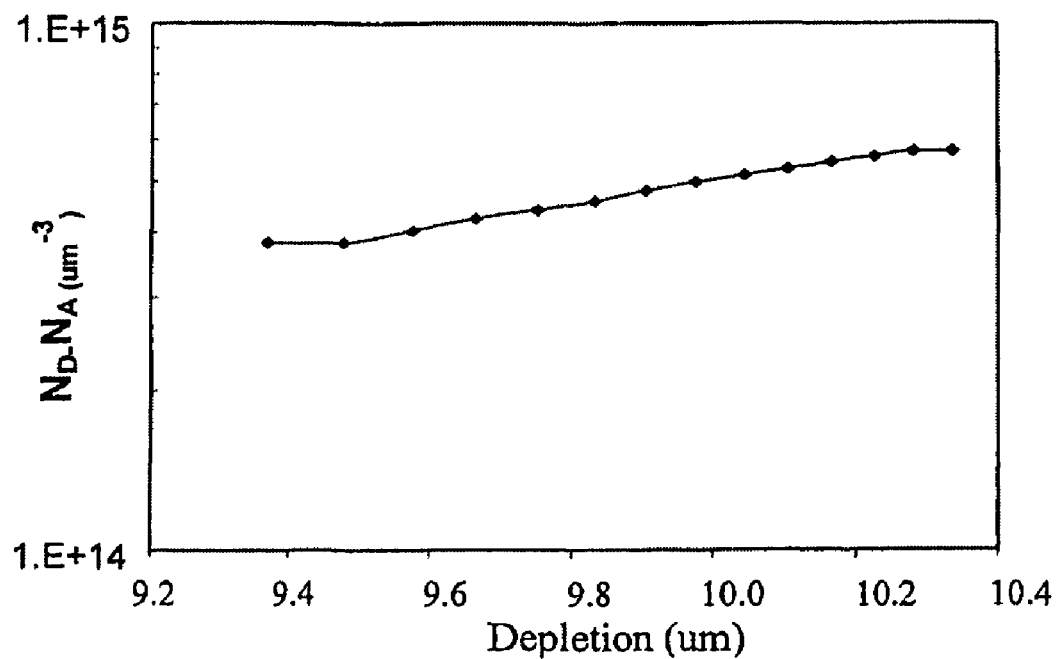

According to the invention, the n- or p-type doping is obtained by an accurate control of the background doping combined with the introduction of a dopant gas, such as nitrogen, so that the dopant atoms concentration in the crystal is below $5 \times 10^{15}$ cm$^{-3}$, and preferably in the $10^{13}$ to $10^{14}$ cm$^{-3}$ range. As shown in FIG. 3, the nitrogen concentration in a 4H crystal grown according to the invention is below the detection limit of analytical measurement such as SIMS. Wafers sliced and polished from such crystals exhibit n-type conductivity with a net carrier concentration in the $10^{14}$ cm$^{-3}$ range (FIG. 4).

According to the invention, the lightly doped crystal is grown by a pure vapour phase method as the HTCVD technique, at a growth rate higher than 100 µm/h. The invention may however as well be carried out by growing the crystal by a method combining the use of pure gas precursors with a Si and C containing source material in a solid or liquid state, as described for example in U.S. Pat. No. 6,048,398, which teachings are hereby incorporated. It has in particular been found that, in order to obtain n-type SiC wafers where the carrier lifetime can optically be measured, it is necessary to decrease the concentration of impurities such as transition metals (e.g. V, Ti, etc.), compensating acceptors (e.g. B and Al). This requires the selection of materials preventing the release of intentional impurities into the crystal during the growth process and the use of purification techniques for both the carrier and the precursors gases used during the growth process. In particular the carbon precursor is preferably chosen to be the methane, which can be manufactured at higher purity grades than other hydrocarbons and can further be purified in-situ by gettering devices. A further finding of the invention is that the growth parameters and crystal cooling rate shall be adjusted so that the density of intrinsic defects acting as recombination centres is kept low and that the remaining intrinsic defects can be annealed out. For example, using the teachings of the patent application SE 0103602-9, the growth conditions can be adjusted so that the as-grown crystal contains silicon vacancies. It was in particular found that the concentration of silicon vacancies could be decreased by an annealing treatment of such crystals. Alternatively, the growth conditions may also be chosen so that for example carbon vacancies are present in the as-grown crystal.

As an example of an earlier known method for producing a silicon carbide single crystal according to the HTCVD technique of the prior art mentioned and incorporated into this description by reference, the following process steps are mentioned:

Introducing a flow of silicon and carbon atoms containing gases into an enclosure, Heating the enclosure containing a seed silicon carbide crystal to a temperature above 1900° C., in such a way that the temperature of the seed crystal remains lower than the temperature at which it would decompose under the partial pressures of the Si and C containing species introduced into the heated enclosure, Maintaining the flows of silicon gas and carbon gas and the temperature above 1900° C. for a sufficient time so that a bulk crystal is grown, Introducing into the crystal, during the time of its growth, a flow of a dopant to make the crystal either n- or p-type, cooling the crystal down from the growth temperature to room temperature at a rate sufficiently slow to decrease the concentration of intrinsic levels below the concentration of shallow impurities acting as dopants, choosing the carbon containing gas to be a hydrocarbon from the group of methane, ethylene and propane and choosing the silicon containing gas from the group of silane, a chlorosilane compound and a methylsilane compound.

The following examples illustrate the conditions identified to meet the light doping and the lifetime requirements of the invention.

Example 1

A SiC single crystal of the 4H polytype was grown in a HTCVD furnace with an average growth rate of 400 µm/h. A small nitrogen flow was added to the silane, ethylene and carrier gas flows fed into the furnace to provide a light n-type doping. Wafers were sliced and polished from this crystal and analysed using the Capacitance-Voltage (C-V), Deep Level Transient Spectroscopy (DLTS), Secondary Ion Mass Spectroscopy (SIMS) and Time Resolved Photoluminescence (TRPL) techniques. The CV and DLTS measurements were identified as not being possible to perform on these wafers due to compensation of the nitrogen donors by at least one deep level. SIMS measurements revealed a Ti contamination at a concentration of $3 \times 10^{15}$ cm$^{-3}$, whereas other impurities such as B, Al and V had at least one order of magnitude lower concentration. TRPL measurements performed on such wafers, either after polishing or after annealing at 1600° C. for 1 hour, showed a decay time less than the detection limit of the experimental setup (<5 ns), making such wafers not appropriate for the purpose of this invention.

Example 2

Figure 5:
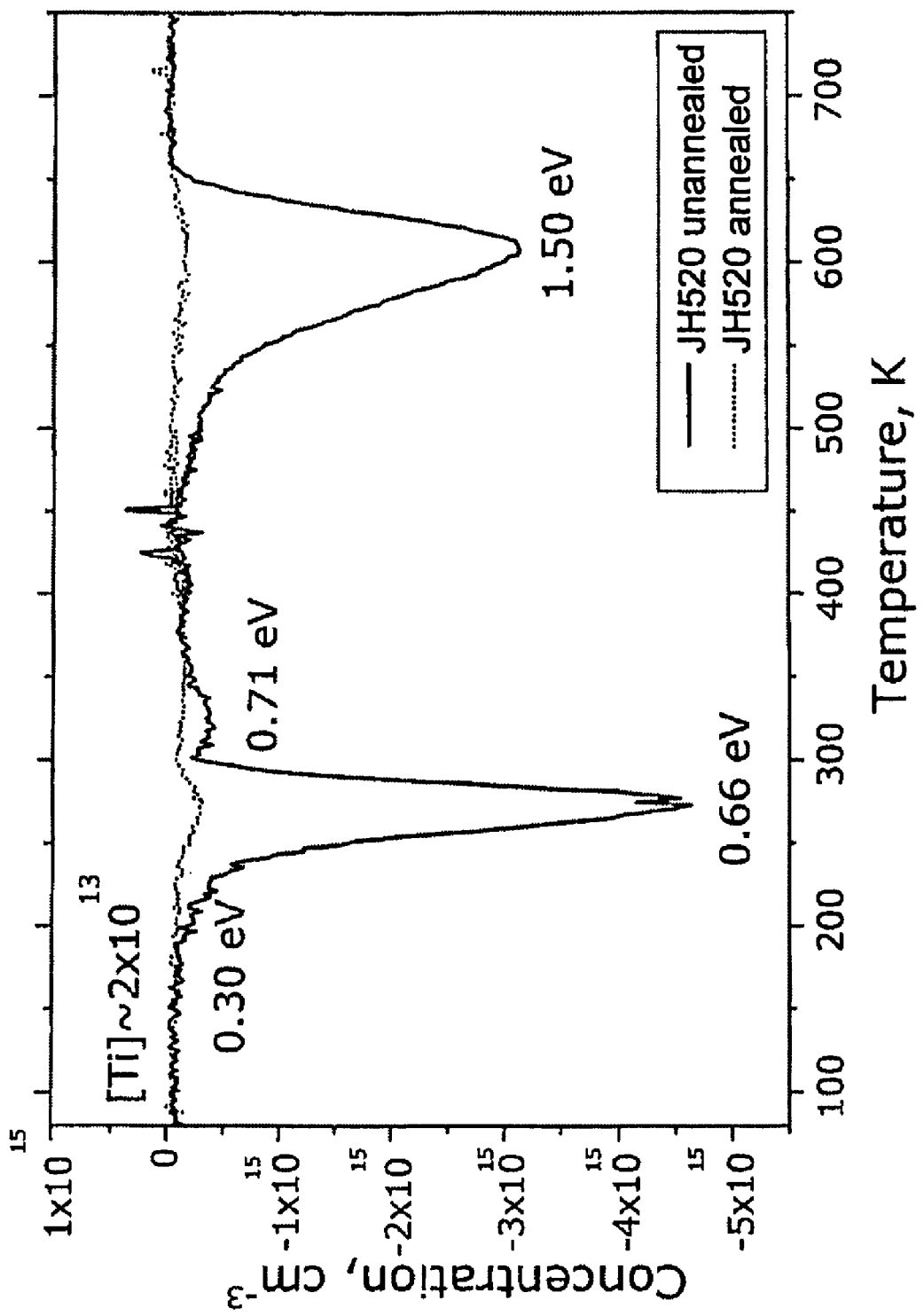
FIG. 5 DLTS spectra measured on a lightly n-type doped 4H SiC wafer before and after annealing in hydrogen ambient.

The growth system was modified to suppress Ti contamination into the growing crystal by selecting components preventing release of unwanted impurities, such as transition metals, into the growth atmosphere. A low-doped n-type 4H SiC crystal was grown in conditions comparable to those in the previous example. The Ti concentration in this crystal was decreased to $5 \times 10^{13}$ cm$^{-3}$. DLTS measurements on as-polished wafers from this crystal showed however the presence of deep levels located at about 0.66 eV and about 1.5 eV from the conduction band with concentrations of $4.5 \times 10^{15}$ cm$^{-3}$ and $3 \times 10^{15}$ cm$^{-3}$, respectively (FIG. 5). The carrier lifetime, measured by TRPL on the same substrate, was less than 5 ns. The wafer was subsequently annealed for 1 hour at a temperature of 1600° C. in a hydrogen ambient. The concentration of the deep levels identified by DLTS in the as-polished wafers was drastically reduced after the annealing (FIG. 5). TRPL measurement also showed that recombination of free carriers with an optical lifetime of approximately 20 ns was observed in the hydrogen annealed wafers. This result can be interpreted as an anneal or a passivation by hydrogen species of intrinsic defects present in the wafer and acting as efficient recombination channels. Intrinsic deep levels such as the silicon and the carbon vacancies, and the silicon antisite, which can act as lifetime killers, have for example been identified in semi-insulating SiC crystals (patent application nr. SE 0103602-9).

Example 3

Figure 6:
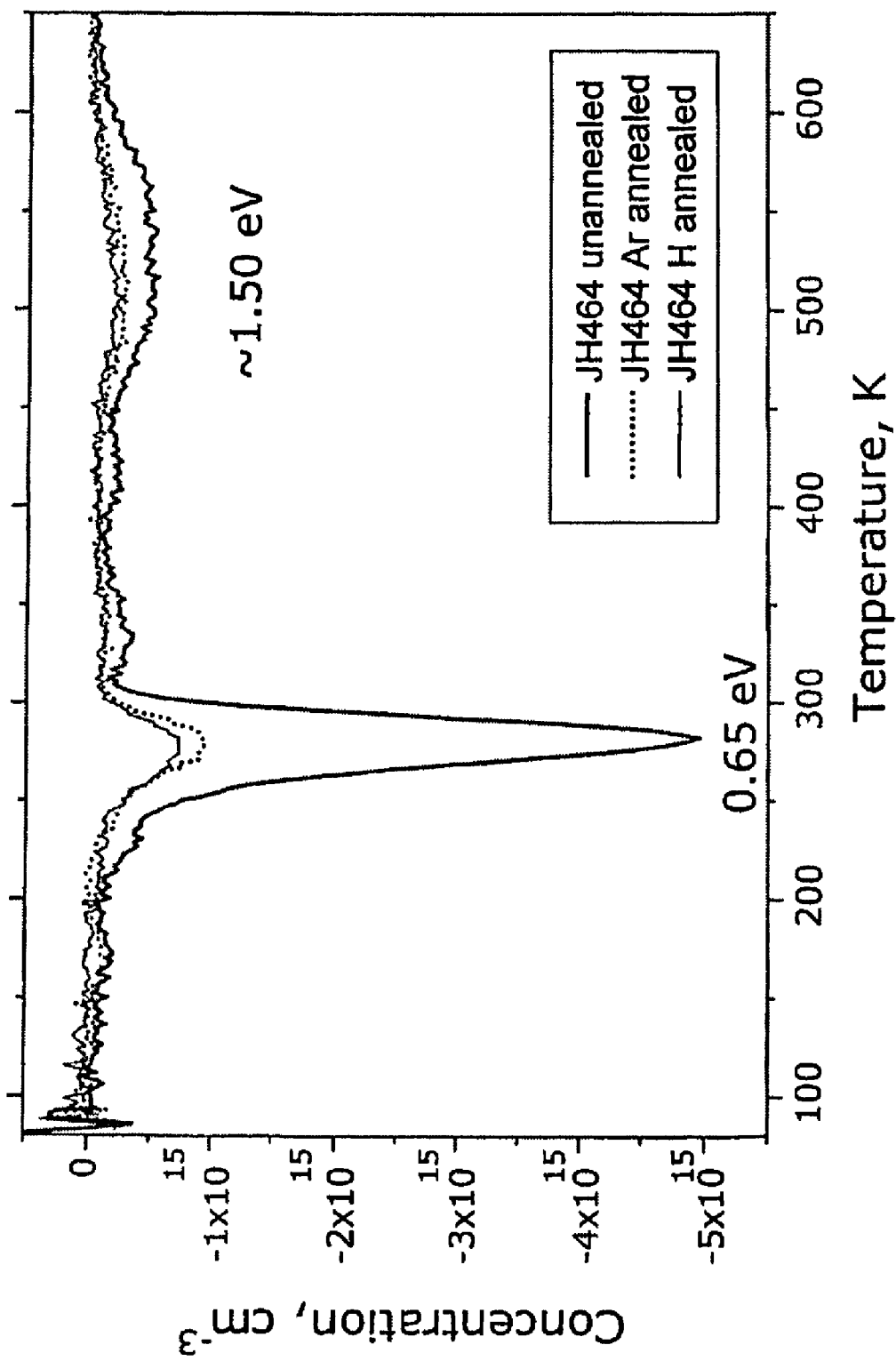
FIG. 6 DLTS spectra measured on a lightly doped 4H SiC wafer grown under modified conditions as described in the invention showing a decrease of the of the $Z_{1/2}$ center concentration after annealing in a hydrogen ambient FIG. 7 Time resolved photoluminescence at room temperature decay curves measured on the wafer of FIG. 6 before annealing, after annealing in argon and after annealing in hydrogen ambients.
Figure 7:
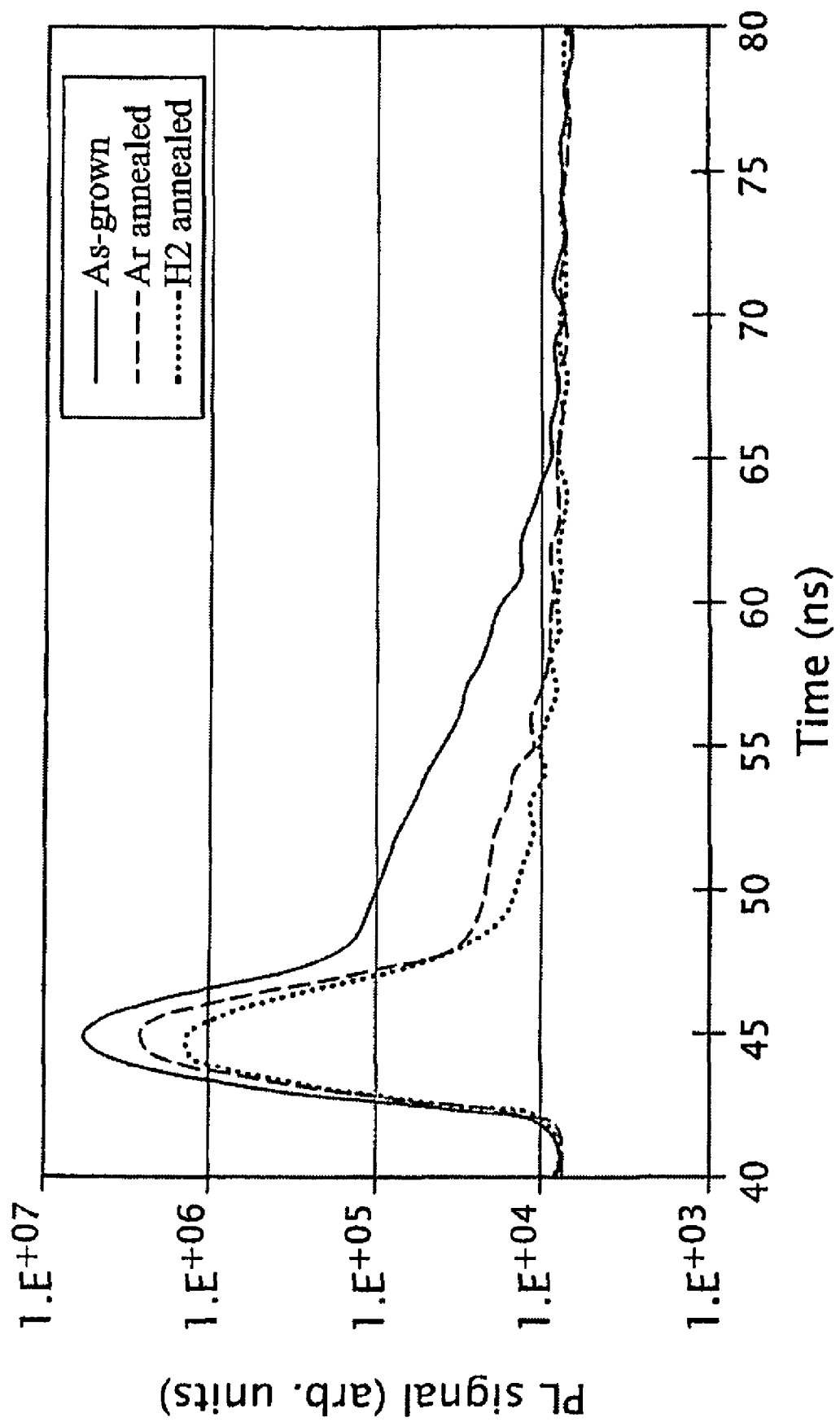

The findings of the previous examples were taken into account by modifying the growth conditions to reduce the concentration of intrinsic defects grown-in in the crystal. In this example, the input C/Si ratio of the ethylene/silane gas mixture was increased. FIG. 6 shows that wafers sliced and polished from such a crystal have a substantially lower concentration of the deep levels identified by DLTS at 1.5 eV, but a similar concentration of the $Z_{1/2}$ level. Upon annealing at 1600° C. in either an hydrogen or an argon ambient, the concentration of both deep levels is decreased, as in the previous example (FIG. 6). The carrier lifetime of the substrate annealed in an hydrogen containing ambient was however increased by a factor 3, to ca. 60 ns (FIG. 7). The carrier lifetime of another wafer cut from the same crystal and annealed in a pure argon ambient however remained below the detection limit of the TRPL system.

It is understood that the teachings of the first embodiment of the invention can be used and improved to further increase the value of the lifetime measured by the optical decay in TRPL to values up to several microseconds to satisfy the current density needs of devices with blocking voltages of 15 kV and above. It is also understood that the lifetime values measured optically may differ from the ones extracted from a bipolar device. The invention however teaches a first method to increase the lifetime value in lightly doped SiC crystals as claimed below.

Device Description

Figure 2:
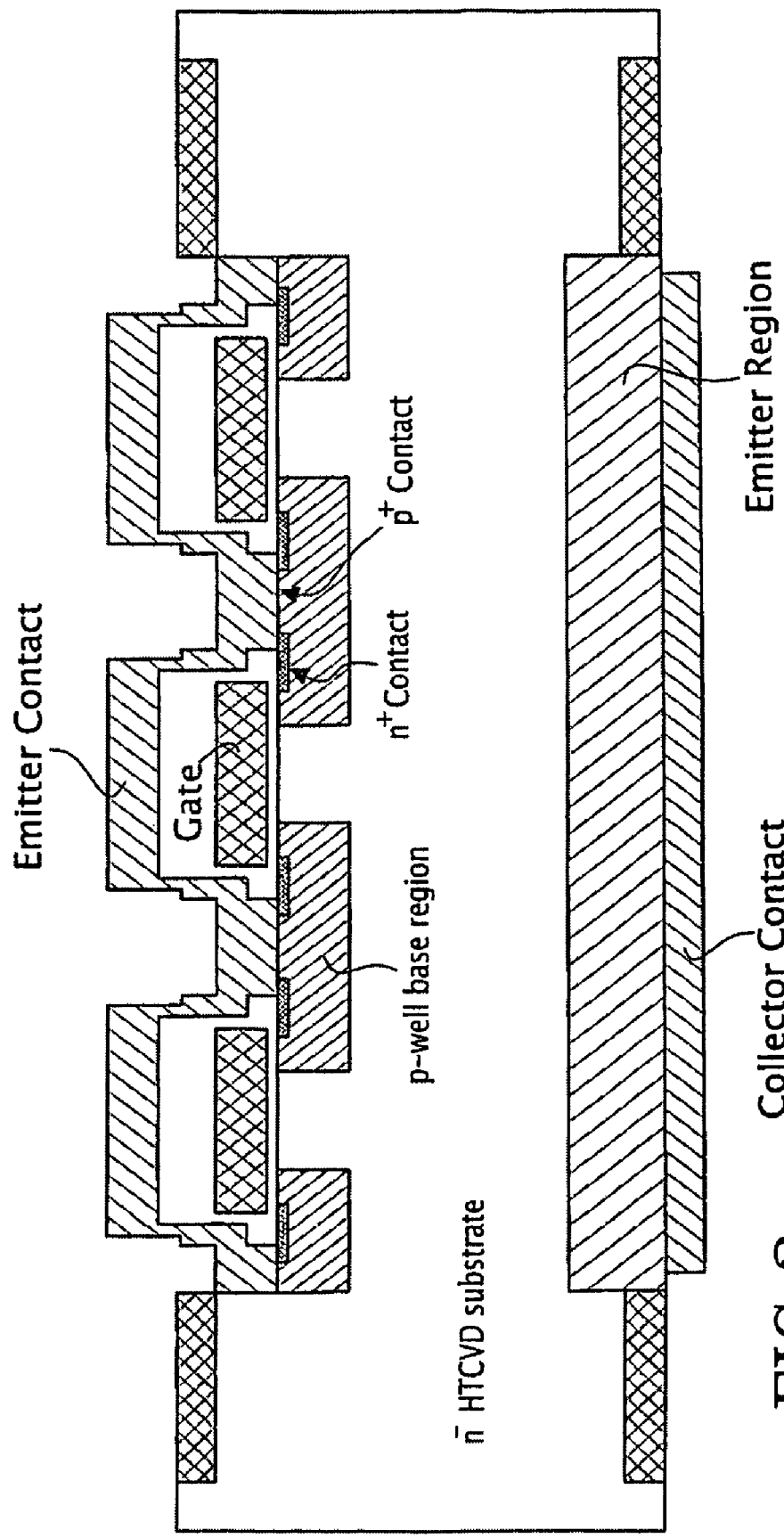
FIG. 2 is a cross-sectional view of a new high voltage IGBT with selectively implanted emitter and junction termination extension at the backside where a N⁻ SiC wafer instead constitutes the drift region having a substantial carrier lifetime.
Figure 8:
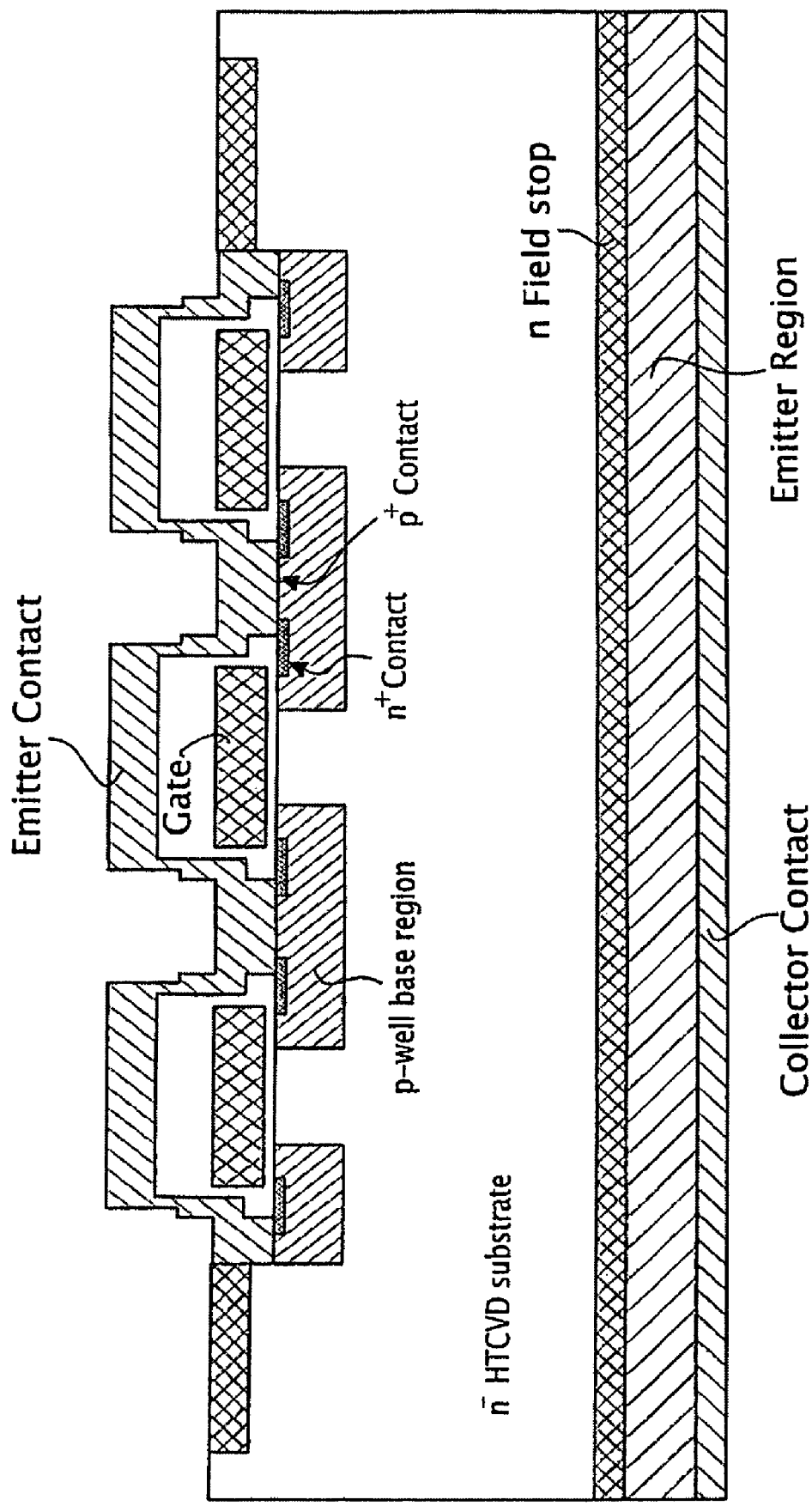
FIG. 8 is a cross-sectional view of a new high voltage IGBT with implanted emitter and field stop layer where a N⁻ SiC wafer constitutes the drift region having a substantial carrier lifetime.
Figure 9:
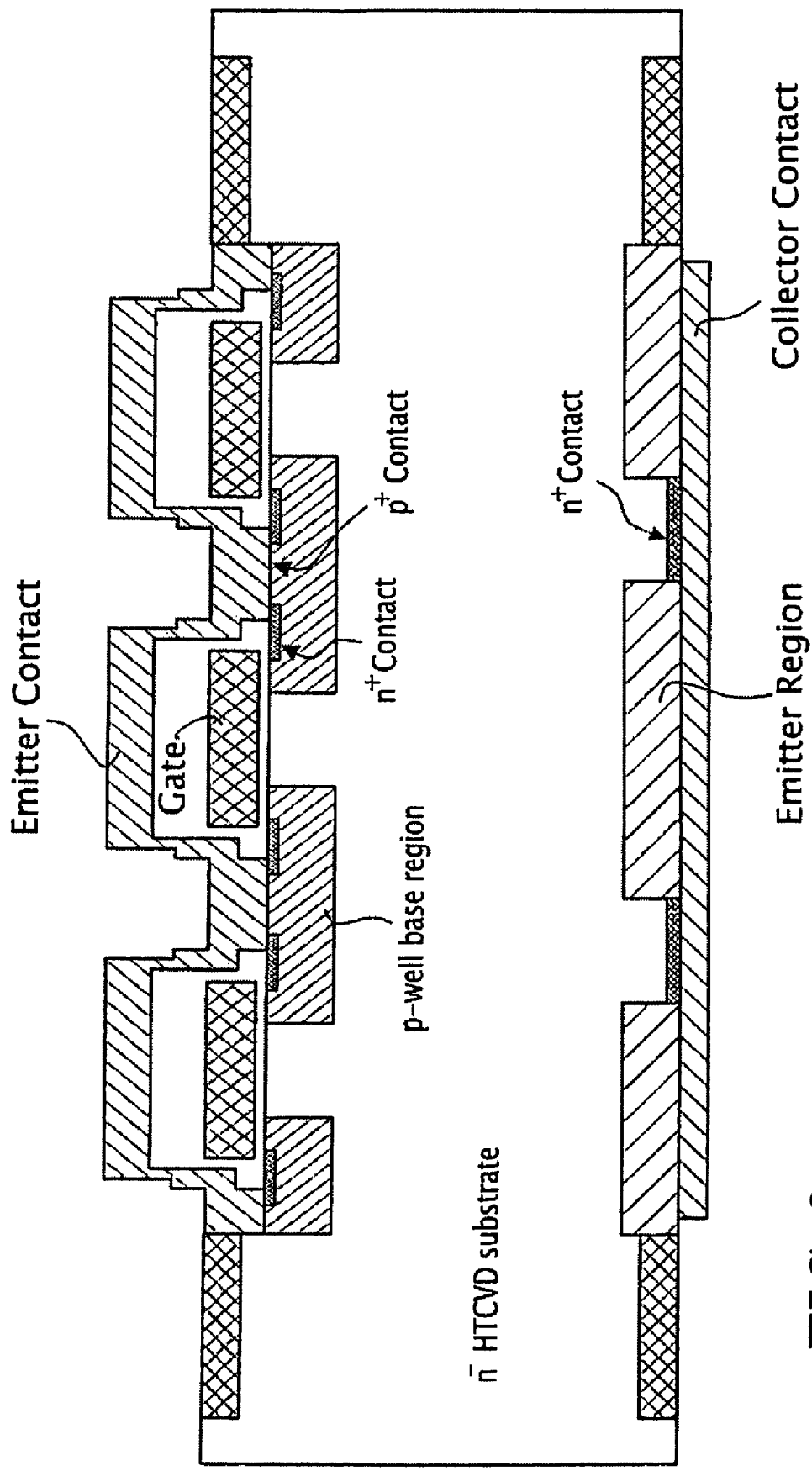
FIG. 9 is a cross-sectional view of a new high voltage IGBT with implanted emitter, junction termination extension and anodic short circuit where a N⁻ SiC wafer constitutes the drift region having a substantial carrier lifetime.

In a second embodiment, the invention proposes a high power bipolar device structure using a lightly doped wafer, manufactured according to any of the embodiments of the invention The invention solves the problem of a high resistive substrate by using low doped wafer as a drift zone, which can simultaneously serve as a mechanical support for the device structure. Such a wafer can be grown by an on-axis process described in the first embodiment. For a thickness exceeding approximately 150 μm, the material will have a sufficient mechanical stability for further processing steps. Now, the emitter can be implemented from the backside by ion-implantation into the masked or unmasked backside surface (FIGS. 8 and 9). This implantation can be optimized in order to obtain an emitter efficiency and minority carrier lifetime especially adjusted for the application demands. Additionally, the implementation of a planar junction edge termination at the backside of the wafer in order to get a reverse blocking device becomes possible using simple process steps (FIG. 2). The here presented disclosure provides the opportunity to fabricate single switching devices able to block very high blocking voltages, which in silicon can be realized only by using serial connection of switches what requires a complicated control circuit. (Example SiC: 250 to 280 μm thick drift zone, $N_D-N_A=3\times10^{14}$ cm$^{-3}$, 20 kV blocking voltage).

The most important advantage of the here presented solution is the possibility to fabricate a semiconductor structure without a substrate, which in the case of a vertical power device represents only an unnecessary additional resistance. The whole wafer now consists of a low doped n-drift zone, able to block a very high voltage (larger than 15 kV). Furthermore, the backward emitter can be carefully designed via ion-implantation into the wafer backside. This can be carried out selectively with or without an additional field stop region. By implementing a junction termination extension at the backside emitter, reverse blocking devices are possible. A further advantage is the possibility to irradiate the backward pn-junction locally in order to adjust the minority carrier lifetime. The adjustment of the structures at the wafer backside to the controlling cells at the front side can be easily performed using large gap objectives for lithography since the SiC wafer itself is transparent for visible light. Thus, the adjustment can be performed with respect to alignment marks at the front-side. Additionally the HTCVD process provides the possibility to carry out an on-axis growth. Therefore, negative influences from anisotropies of the electrical breakdown field, e.g., can be minimized or excluded.

Example

Non Limiting Example

FIG. 9 shows a cross section of a postulated new IGBT structure using a lightly doped n⁻ substrate as the active device layer.

The N⁻ wafer should be doped according to the desired blocking voltage of the device. The minimum thickness of the layer is given by the ability of the technology to handle thin wafers. Assuming state of the art processes, this limit can be found around 150 μm. However, future developments can shift this thickness to lower values. Into the drift zone the p-well base region__5 is implanted, diffused or created by selective epitaxial growth. The depth of this layer can range from some nanometers to several micrometers, depending on the used technology. The doping can vary between $1\times10^{16}$ cm$^{-3}$ up to values higher than $10^{20}$ cm$^{-3}$. Typically it lies in the range of some $10^{18}$ m$^{-3}$ and $10^{19}$ cm$^{-3}$. The spacing between the p-wells can range from some μm up to 100 μm. At the surface of the N− wafer and within the p-well, the n-type_source region is located. The distance between the source region and the edge of the p-well at the surface defines the channel length of the device and can be between 1 μm and up to 100 μm, typically for power devices are values around 2 to 4 μm. The source region is formed by a region of n-type conductivity with a doping higher than used for the p-region, typically above $10^{19}$ cm$^{-3}$. At the periphery of the device a JTE (U.S. Pat. No. 5,712,502) is implemented. Above the channel region with a certain overlap over the source region and completely overlapping the spacing between the p-well, the gate oxide is located. As the gate oxide, all common thin film isolators like silicon dioxide, silicon nitride or other novel dielectrics can be used. Typical for power devices are approx. 80 nm thick silicon dioxide layer, thermally grown or deposited. As the gate material, a highly conductive material like a metal, a metal suicide or polysilicon can be used. This gate is electrically isolated from the large area front side emitter contact. This contact layers are usually formed by thick metals like Aluminum or others. The layers above the p-well (oxide, gate electrode) act as a control region. At the backside of the structure, the collector contact regions can be found. This collector contact can be placed over the whole area opposite to the active region (p-wells) or can be spaced by small areas with ohmic contacts to the lightly doped wafer. The collector region (backside emitter) is of opposite conductivity to the lightly doped wafer, its doping exceeds the doping of the wafer. Typical values are between $10^{17}$ cm$^{-3}$ and $10^{19}$ cm$^{-3}$. For the depth and forming of this layers the rules for the p-well apply. The width and spacing will be choosing in the range of some μm or more in order to ensure in the blocking case a sufficient shielding effect while maintaining injection in the forward direction. For reverse blocking, a JTE corresponding to the JTE at the front side can be implemented. The layers at the backside can be aligned to the front side structures due to the transparent SiC wafer. This is an important advantage compared to Silicon solutions. Additionally, the backside structure can be formed by selective doping directly in the surface due to the fact that the whole wafer acts as the active zone of the device.

The invention claimed is:

1. A method for manufacturing a silicon carbide single crystal, the method comprising:
    growing a silicon carbide single crystal, wherein:
        said crystal has a boron concentration less than $5 \times 10^{14}$ cm$^{-3}$, and a concentration of transition metals impurities less than $5 \times 10^{14}$ cm$^{-3}$,
        intrinsic defects in the crystal are minimised and
        said intrinsic defects comprising silicon vacancies or carbon vacancies
    and
    annealing, for a desired time, said crystal at a temperature above 700° C. in an atmosphere containing any of the gases:
        hydrogen,
        a mixture of hydrogen and an inert gas
    so that the density of intrinsic defects and any associated defects is decreased to a concentration low enough to confer to the crystal a desired carrier life time of at least 50 ns at room temperature.

2. The method according to claim 1, further comprising:
    slicing and polishing a wafer from said crystal before the step of annealing the crystal.

3. The method according to claim 1, further comprising:
    slicing a wafer from said crystal.

4. The method according to claim 3, further comprising:
    polishing said wafer.

5. The method for growing said single crystal of silicon carbide according to claim 1, wherein the method further comprising:
    introducing a flow of silicon and carbon atoms containing gases into an enclosure,
    heating the enclosure containing a seed silicon carbide crystal to a temperature above 1900° C., in such a way that the temperature of the seed crystal remains lower than the temperature at which it would decompose under the partial pressures of the Si and C containing species introduced into the heated enclosure,
    maintaining the flows of silicon gas and carbon gas and the temperature above 1900° C. for a sufficient time so that a bulk crystal is grown, and
    introducing into the crystal, during the time of its growth, a flow of a dopant to make the crystal either n- or p-type.

6. The method according to claim 5, further comprising:
    cooling down the crystal from the growth temperature to room temperature at a rate sufficiently slow to decrease the concentration of intrinsic levels below the concentration of shallow impurities acting as dopants.

7. The method according to claim 5, wherein the carbon containing gas comprises a hydrocarbon chosen from the group of methane, ethylene and propane.

8. The method according to claim 5, wherein the silicon containing gas is chosen from the group of silane, a chlorosilane compound and a methylsilane compound.

9. The method according to claim 1, wherein said crystal has a boron concentration less than $5 \times 10^{13}$ cm$^{-3}$, and a concentration of transition metals impurities less than $5 \times 10^{13}$ cm$^{-3}$.

* * * * *